US008605516B2

(12) United States Patent
Moore et al.

(10) Patent No.: US 8,605,516 B2
(45) Date of Patent: Dec. 10, 2013

(54) ULTRA-LOW-POWER VARIATION-TOLERANT RADIATION-HARDENED CACHE DESIGN

(75) Inventors: Christopher D. Moore, Pasadena, CA (US); Sean J. Keller, San Diego, CA (US); Alain J. Martin, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 295 days.

(21) Appl. No.: 12/683,989

(22) Filed: Jan. 7, 2010

(65) Prior Publication Data

US 2010/0172195 A1 Jul. 8, 2010

Related U.S. Application Data

(60) Provisional application No. 61/204,492, filed on Jan. 7, 2009.

(51) Int. Cl.
*G11C 11/34* (2006.01)

(52) U.S. Cl.
USPC .......................................... 365/188; 365/149

(58) Field of Classification Search
USPC ........................ 365/149 X, 188 O, 149, 188
See application file for complete search history.

(56) References Cited

U.S. PATENT DOCUMENTS

| | | | |
|---|---|---|---|
| 5,949,706 A * | 9/1999 | Chang et al. | 365/156 |
| 6,809,979 B1 * | 10/2004 | Tang | 365/222 |
| 7,558,134 B2 * | 7/2009 | Kitagawa | 365/196 |
| 2002/0017924 A1 | 2/2002 | Knowles | |
| 2005/0259462 A1 | 11/2005 | Wood | |
| 2006/0001442 A1 | 1/2006 | Wood et al. | |
| 2007/0052442 A1 | 3/2007 | Fulkerson | |
| 2007/0103194 A1 | 5/2007 | Erstad | |
| 2007/0109865 A1 | 5/2007 | Maki et al. | |

OTHER PUBLICATIONS

International Search Report and Written Opinion, International application No. PCT/US2010/020385, International filing date Jan. 7, 2010, mailed Aug. 30, 2010.
International Search Report mailed Aug. 30, 2010, International application No. PCT/US2010/020387, International filing date Jan. 7, 2010.
Calhoun, B. et al., "A 256-kb 65-nm sub-threshold SRAM design for ultra-low-voltage operation," IEEE Journal of Solid-State Circuits, vol. 42, No. 3, Mar. 2007, pp. 680-688.
Liang, X. et al., "Process variation tolerant 3T1D-based cache architectures," 40th IEEE/ACM International Symposium on Microarchitectures, Dec. 1, 2007, pp. 15-26.
Zhai, B. et al., "A variation-tolerant sub-200 mV 6-T subthreshold SRAM," IEEE Journal of Solid-State Circuits, vol. 43, No. 10, Oct. 2008, pp. 2338-2348.
Calin, T. et al., "Upset hardened memory design for submicron CMOS technology," IEEE Transactions on Nuclear Science, vol. 43, No. 6, Dec. 1996, 2874.

* cited by examiner

*Primary Examiner* — Vanthu Nguyen
(74) *Attorney, Agent, or Firm* — Gates & Cooper LLP

(57) ABSTRACT

A random access memory (RAM) cell provides a control section and a storage section coupled to the storage section. The storage section includes complementary metal-oxide semiconductor (CMOS) transistors and the storage section is read by precharging the control section to a virtual drain voltage.

10 Claims, 7 Drawing Sheets

ULTRA-LOW-POWER VARIATION-TOLERANT RADIATION-HARDENED CACHE DESIGN

CROSS-REFERENCE TO RELATED APPLICATIONS

This application claims the benefit under 35 U.S.C. Section 119(e) of the following commonly-assigned U.S. provisional patent application(s), which is/are incorporated by reference herein:

Provisional Application Ser. No. 61/204,492, filed on Jan. 7, 2009, by CHRISTOPHER D. MOORE, SEAN J. KELLER, ALAIN J. MARTIN, entitled "Ultra-low-power variation-tolerant radiation-hardened cache design".

STATEMENT REGARDING FEDERALLY SPONSORED RESEARCH AND DEVELOPMENT

The Government has certain rights in this invention pursuant to Grant No. CCF-0541461 awarded by the National Science Foundation (NSF).

BACKGROUND OF THE INVENTION

1. Field of the Invention

The present invention relates generally to memory cache, and in particular, to a method, apparatus, and article of manufacture for a low-power and radiation tolerant cache design.

2. Description of the Related Art (Note: This application references a number of different publications as indicated throughout the specification by reference numbers enclosed in brackets, e.g., [x]. A list of these different publications ordered according to these reference numbers can be found below in the section entitled "References." Each of these publications is incorporated by reference herein.)

Nearly all modern microprocessors incorporate memory caches for both data and instructions. These caches take advantage of the strong correlations in both space and time between multiple accesses to main memory. Storing a copy of the current working set of both instructions and data in the processor results in an enormous reduction of processor to memory I/O which in turn leads to substantial reduction in the average memory access time and the average memory power consumption. Unfortunately, caches are highly customizable, and the design space is vast. It follows that when designing a cutting edge low-power microprocessor, the cache architecture and size are paramount design concerns. Moreover, as caches tend to occupy a substantial portion of the die, designing towards the additional goal of robust radiation hardened chips only increases the importance of the cache design. To date that has been widely overlooked in both industry and academia.

SUMMARY OF THE INVENTION

In order to address this need, embodiments of the invention provide a design and simulation of two very different caches. The competing goals of low-power and radiation tolerance are satisfied with the use of asynchronous quasi-delay-insensitive (QDI) single-event-upset (SEU) tolerant circuits across both caches. However, the storage cell type and the means of error correction differ substantially between the two designs. The first design utilizes error-correcting codes (ECC) along with a custom 4T-DRAM (dynamic random access memory) cell; whereas, the second design leverages two interlocked 6T-SRAM (static random access memory) cells per bit of data.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

4T-DRAM

The DRAM cache utilizes SEU tolerant QDI circuits on all of the access buses, encoders, and decoders, and the data are protected with custom ECC codes that are optimized to reduce power consumption. In order to correct upsets, the banks must be periodically scrubbed. The design of the present invention takes advantage of this fact by using custom DRAM cells instead of the SRAM cells found in most caches; the cache can then scrub all banks during the standard DRAM refresh cycle. The custom DRAM cell of the present invention is a novel 4T cell (see FIG. 1) with duplicated read and write word lines to tolerate word line SEUs. This 4T DRAM cell is capable of operating deep into the subthreshold region, which results in a substantial power savings. The layout of the cell of the present invention has been completed in a modern IBM 65-nm low power CMOS technology. The layout has been extracted using Mentor Graphics Calibre along with the parasitics data provided by IBM and simulated with Synopsys HSPICE using IBM-provided BSIMv4 models. The simulations show that the cell works exceptionally well at $V_{DD}$=350 mV.

4T-DRAM Cell

The 4T DRAM cell is loosely based on the standard 3T cell [3] with one additional transistor. This novel 4T cell (see FIG. 1) has far superior noise margins over the 3T cell and has been specifically designed to operate under aggressive voltage scaling from the nominal process $V_{DD}$ deep into sub-threshold operation.

Figure 1:
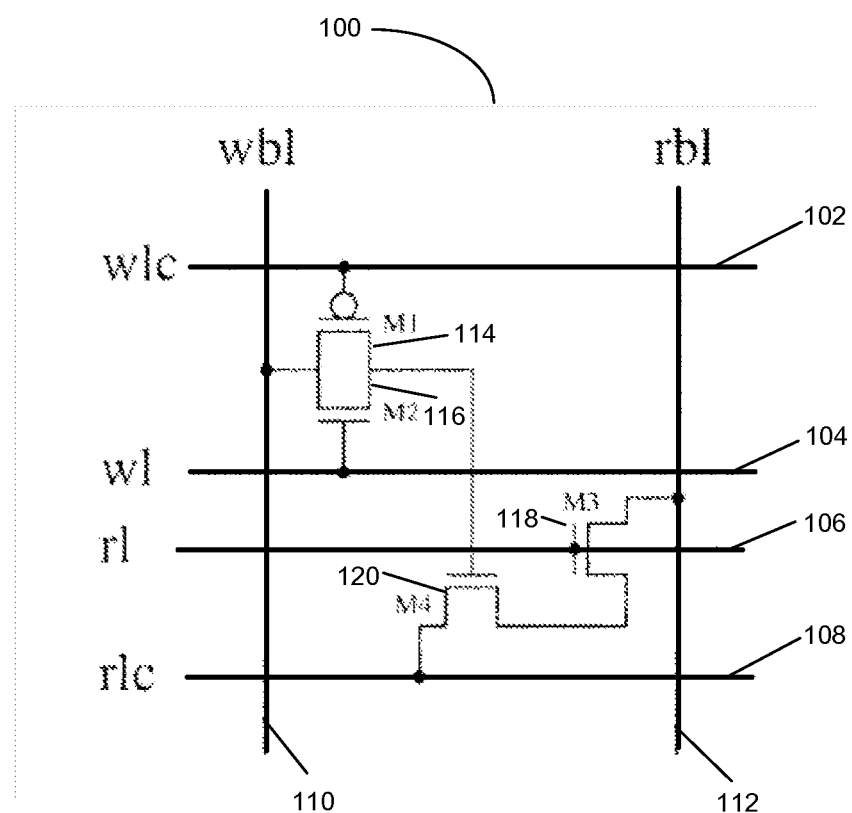
FIG. 1 illustrates a 4T DRAM cell utilized in accordance with one or more embodiments of the invention.

FIG. 1 illustrates cell 100 with Write Line Control (wlc) 102, Write Line (wl) 104, Read Line (rl) 106, Read Line Control (rlc) 108, Write Bit Line (wbl) 110, Read Bit Line (rbl) 112, and transistors M1-M4 114-120 connected as shown. A value is written into the 4T cell 100 by lowering wlc 102, raising wl 104, and driving the logic value to be written into cell 100 onto wbl 110. The logic value is stored on the gate of M4 120 and the electrically connected diffusion capacitance of M1 114 and M2 116. The "extra" transistor in cell 100 is M1 114. M1 114 helps provide proper operation in modern processes where the nominal $V_{DD}$ may be less than $2V_{tn}$. M1 114 and M2 116 form a transmission gate that can properly pass a logical "1" as $V_{DD}$ instead of $V_{DD}$-$V_{tn}$, as is the case for the 3T cell with only a single NMOS pass-gate.

A value is read from the 4T cell 100 by precharging rbl 112 to $V_{DD}$/2, raising rl 106, and lowering rlc 108. If a logic 1 is stored in the cell 100 then M4 120 pulls rbl 112 down through M3 118, else rbl 112 is pulled up to $V_{DD}$ by the weak bitline driver. M3 118 serves two important purposes in the present invention. First M3 118 greatly reduces leakage from rbl 112 to rlc 108 allowing more cells to be stacked onto the same rbl 112; in addition, M3 118 prevents a single error on a read bitline from corrupting every bit in a read operation.

4T-DRAM Simulations

Figure 2:
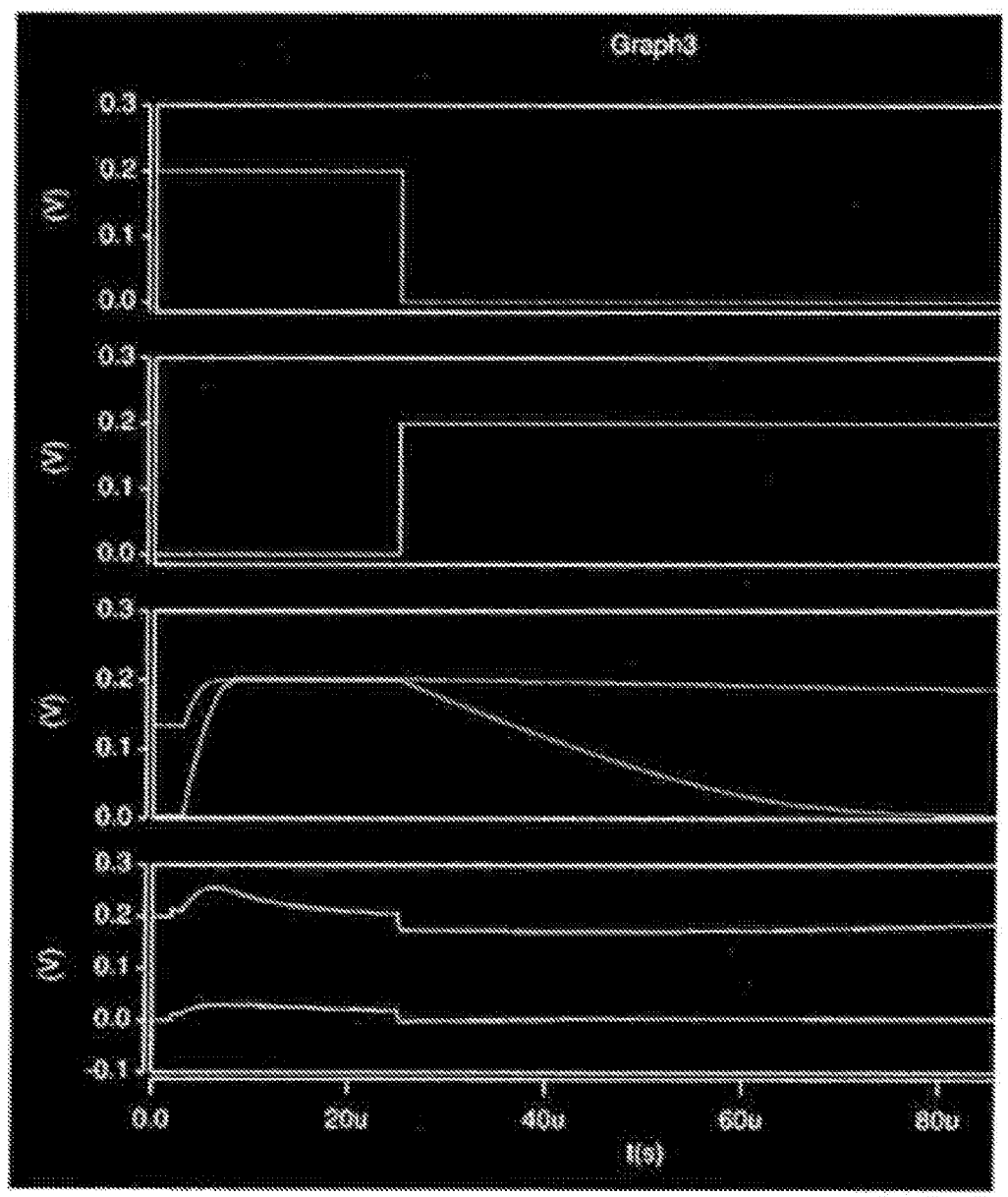
FIG. 2 illustrates a 4T-DRAM cell at $V_{DD}$=200 mV read 0/1 overlayed in accordance with one or more embodiments of the invention.

The cell has been simulated under a circuit simulator (e.g., HSPICE™) using IBM's™ 65-nm low-power CMOS (complementary metal-oxide-semiconductor) logic process BSIM v4 (Berkeley Short-Channel IGFET [insulated-gate field-effect transistor] Model version 4) models as shown in FIG. 2. This process is a standard twin or triple well process with support for high and low $V_{th}$ transistors, a nominal $V_{DD}$ of 1.2V, and thresholds: 400 mV<$V_{tn}$<600 mV and -600 mV<$V_{tp}$<-400 mV.

The cell also operates properly at $V_{DD}$=350 mV when process variations are included. Under a 1000 sample Monte Carlo sweep of all process parameters using IBM's™ variation models, the cell still appears to be able to pull rbl 112 down to 150 mV in the worst case. This implies that the sense amps must be able to differentiate $V_{DD}$ from $V_{DD}$/2, a reasonable assumption.

These simulations include a heavily loaded rbl 112, but do not include the leakage paths through M3 118 and M4 120 on the other cells connected to rbl 112. Additionally, the other long bit lines and word lines are not as loaded (in terms of total capacitance to $V_{SS}$) as they will be by the gate and diffusion capacitance of other cells. A full-custom layout of a bank array must be complete in order to generate the most accurate circuit simulations, but the current single cell simulations (with estimated line loads) suggest that the cell design is very robust.

12T-SRAM (Interlocked 6T-SRAM)

Figure 3:
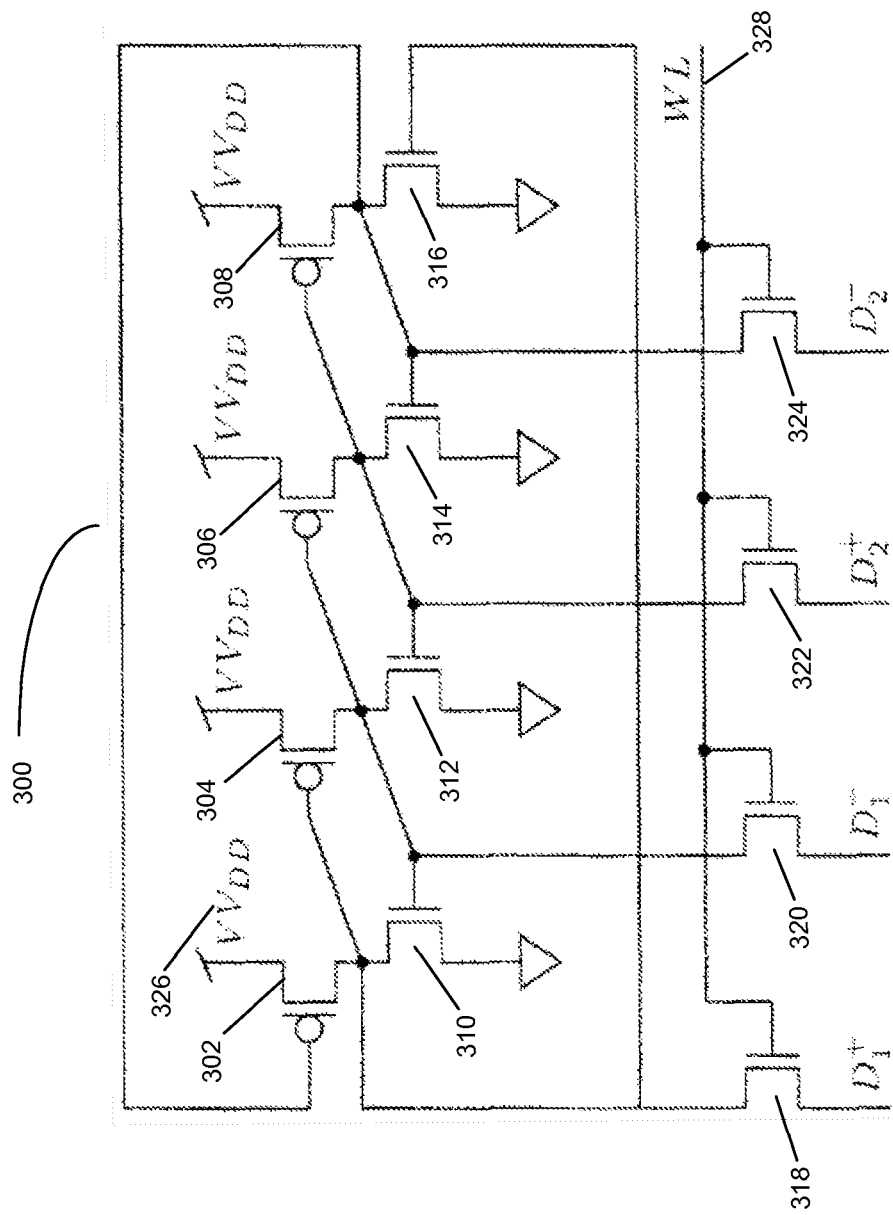
FIG. 3 illustrates a 12T-SRAM cell utilized in accordance with one or more embodiments of the invention.

The SRAM cache utilizes SEU tolerant QDI circuits on all of the access buses, encoders, and decoders, and the data are protected by utilizing a modified version of Calin's [2] self-correcting dual-interlocked-storage-cell 300 (DICE) (see FIG. 3). Within cell 300, transistors 302, 304, 306, 308, 310, 312, 314, and 316 act as a Complimentary Metal Oxide Semiconductor (CMOS) read/write portion of the cell 300, and transistors 318, 320, 322, and 324 act as the storage portion of cell 300 for the data to be stored. The present invention comprises an addition of a virtual-$V_{DD}$ ($VV_{DD}$) voltage level 326 within cell 300. From [1], the substitution of a $VV_{DD}$ for $V_{DD}$ on PMOS (p-type metal-oxide-semiconductor) source terminals of transistors 302-308 can greatly increase the robustness of a 6-T SRAM cell in sub-threshold operation; with this addition, the ratioed fight between the NMOS (n-type metal-oxide-semiconductor) pass transistors 310-316 and the PMOS pull-up transistors 302-208 can be entirely avoided by "disabling" each PMOS transistor 302-308 during a write operation. The simulations show that the effects are similar in the 12-T DICE. The next modification to the DICE design is the complete decoupling of the two bitlines into four distinct bitlines; this greatly increases the robustness of the design with respect to sensing the values on a read operation. The layout of the cell has been completed in a modern IBM™ 65-nm low power CMOS technology, but a full parasitic extraction has not been performed. The cell has been simulated with Synopsys™ HSPICE using IBM™ provided BSIMv4 models. The simulations show that the cell works very well at $V_{DD}$=350 mV.

12T-SRAM Cell

The DICE design has been modified specifically to achieve operation under aggressive voltage scaling from the nominal process $V_{DD}$ deep into sub-threshold operation and to be highly tolerant to single-event-upsets, but the basic properties of the cell remain unchanged. One way to understand the inner workings of the cell is to consider it as two standard 6T-SRAM cells that have been cross-coupled to form two opposing rings of NMOS and PMOS "inverters". Due to this ring structure, any single upset will be self-corrected by the opposing transistors in the ring. Calin explains this property well in [2]. As such, transistors 302-316 act as the control section, and transistors 318-324 act as the storage section of the cell, with cross-coupling of the gates and drains of transistors 302-316 keeping the storage section transistors 318-324 from leaking capacitance. Further, the storage of the value and its complement offsets the leakage problems as well as SEU of the storage of the cell.

Operation of the cell is similar to that of a 6T-SRAM cell with duplicated bit lines. A value is written to cell 300 by lowering $VV_{DD}$ 326, raising wl 328, and driving the value to be written on $D_1^+$ 318 and the duplicate $D_2^+$ 322; the complemented value is driven onto $D_1^-$ 320 and $D_2^-$ 324. A value is read from cell 300 by pre-charging all four bitlines to $V_{DD}$/2 and asserting wl 328. The four bitlines drive four distinct sense amplifiers in order to preserve SEU tolerance.

Figure 4:
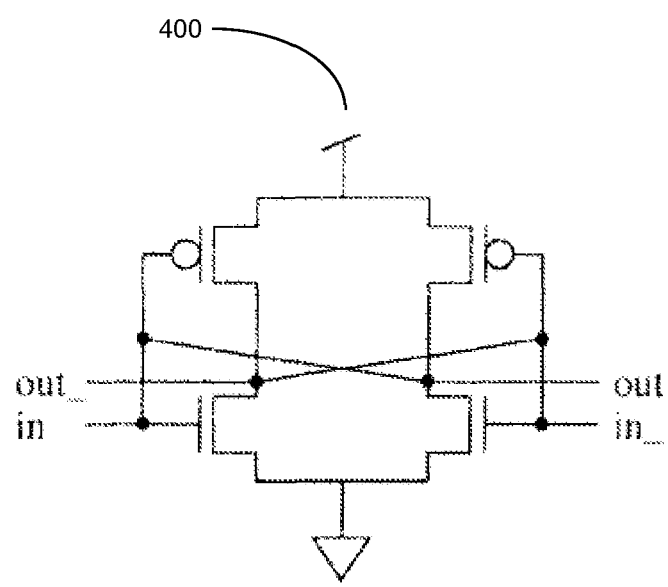
FIG. 4 illustrates a common sense amplifier utilized in accordance with one or more embodiments of the invention.
Figure 5:
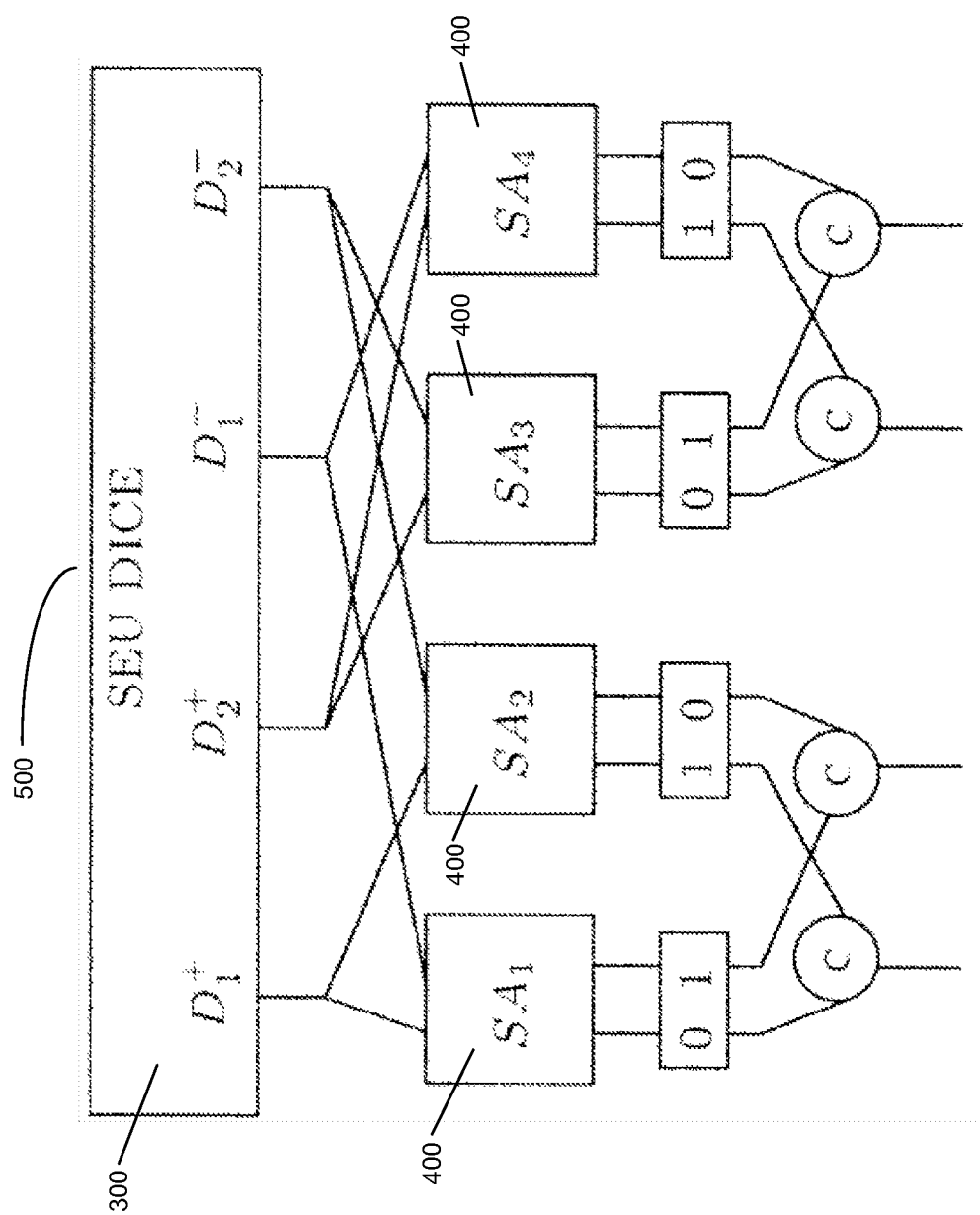
FIG. 5 illustrates a quad sense amplifier utilized in accordance with one or more embodiments of the invention.

Although new sense amplifier designs are compatible with the present invention, existing designs such as shown in FIG. 4 are also compatible with the present invention. The architecture of the present invention utilizes four classic cross-coupled inverter sense-amps 400 (see FIG. 4) with some small surrounding circuitry. The quad sense-amp design 500, shown in FIG. 5, shows cell 300 and amplifiers 400 coupled to additional circuitry which satisfies a number of important constraints. The DICE design guarantees that any single error can only transiently propagate to one other storage node, so sensing each permutation of a bitline and its complement prevents an SEU during a read operation from corrupting the output. Moreover, the correct value is guaranteed to eventually propagate, and since the surrounding circuitry is QDI, timing violations and data corruption will never occur in the event of an excessively slow read operation induced by an SEU.

12T-SRAM Simulations

Figure 6:
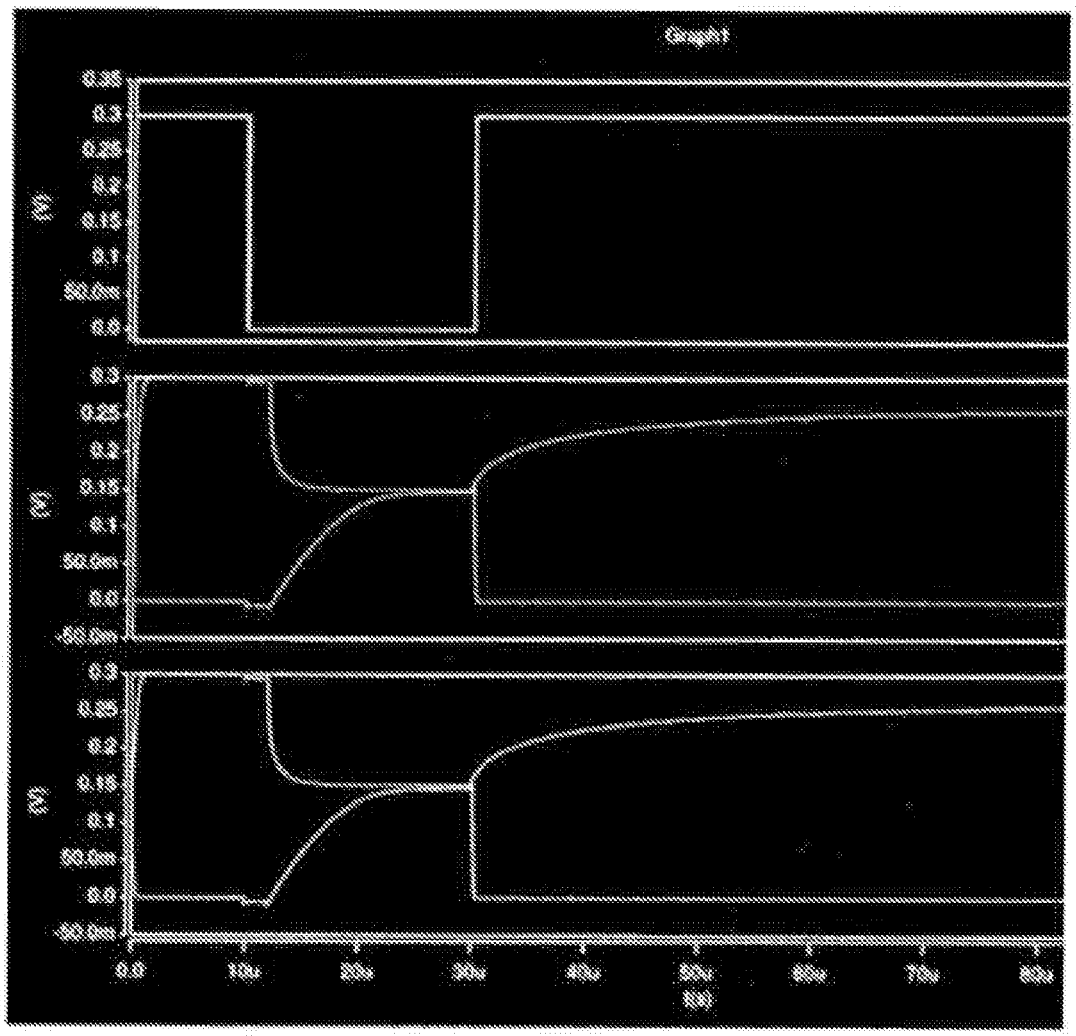
FIG. 6 illustrates a 12T-SRAM cell at $V_{DD}$=300 mV read 0/1 overlayed in accordance with one or more embodiments of the invention.

The 12T-SRAM cell has been simulated under HSPICE using the same process parameters and simulation decks as those used in the 4T-DRAM simulations. FIG. 6 shows that the cell operates properly when reading and writing both a "0" and a "1" at 300 mV.

Similar to the 4T-DRAM, the 12T-SRAM cell also operates properly at $V_{DD}$=350 mV when process variations are included. Under a 1000 sample Monte Carlo sweep of all process parameters using IBM's™ variation models, the cell still appears to be able to properly drive the bitlines. However, the cell can write a substantially stronger "0" than "1" due to the single NMOS pass-transistors guarding the bitlines. This along with the relatively long bit-line charge time, makes it clear that sense-amps are unavoidable.

As for the 4T-DRAM simulations, the line capacitances have been estimated. Only the full layout and extraction of a bank will yield highly accurate HSPICE simulations. However, the approximated single cell simulations (with estimated line loads) suggest that the 12T-SRAM cell design is very robust.

Design Comparison

Both cache designs are robust to single-event-upsets, operate sub-threshold, and are tolerant to process parameter variation. However, after completing the micro-architecture design of the 4T-DRAM cache, and completing the layout of both designs, the 12T-SRAM style has a number of clear advantages.

First, the ECC (error correction control) overhead and the control overhead for refreshing the banks result in similar bit densities for both caches. However, the 12T-SRAM is significantly more robust to upsets. This increased robustness is due to the fact that each bit is duplicated in the 12T-SRAM, so the cache can tolerate an upset on every single data-bit at any time. In the 4T-DRAM, upset tolerance is guaranteed by an ECC mechanism that only permits a single upset to occur per cache-line per refresh cycle.

Second, the 12T-SRAM micro-architecture is significantly simpler than the 4T-DRAM micro-architecture. A large complication in the 4T-DRAM design is the need to regularly refresh the banks in order to scrub the cache and to restore values in the face of normal DRAM charge leakage. The hardware required to control this task is large and complicated. Moreover, this refresh requirement turns a read operation into a read, error correct, write operation. As such, the read cycle-time is at least an order of magnitude greater than the read latency. This discrepancy requires that the cache be heavily banked in order to maintain a reasonable level of performance. This banking requirement also adds to the 4T-DRAM complexity. Finally, the ECC logic clearly adds substantial complexity to the design.

Lastly, as pointed out in [2], a 12T DICE can be constructed by replacing the interconnect in a commercial 6T-SRAM layout. The custom 12T cell only differs in the wiring, so an existing 6T layout can be utilized for the target process. On the other hand, the 4T-DRAM requires a full-custom layout and all the associated testing and verification.

Process Chart

Figure 7:
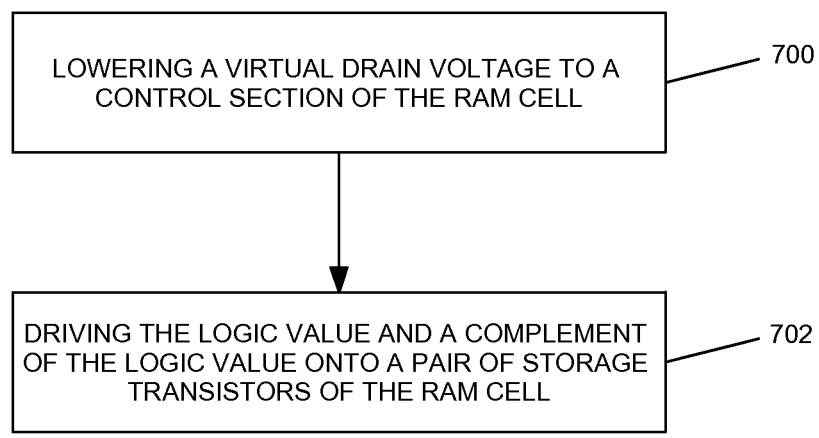
FIG. 7 illustrates a process chart in accordance with one or more embodiments of the present invention.

FIG. 7 illustrates a process chart in accordance with one or more embodiments of the present invention.

Box 700 illustrates lowering a virtual drain voltage to a control section of the RAM cell.

Box 702 illustrates driving the logic value and a complement of the logic value onto a pair of storage transistors of the RAM cell.

Conclusion

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention. In summary, embodiments of the invention provide for methods for storing data and RAM cells that operate below threshold voltages for the transistors in the RAM cells.

A Four-Transistor (4T) random access memory (RAM) cell in accordance with one or more embodiments of the present invention comprises a first transistor of a first conduction type, a second transistor of a second conduction type, wherein the first transistor and the second transistor comprise a transmission gate, a third transistor having a gate electrode coupled to the transmission gate for storing a logic value in the 4T RAM cell, and a fourth transistor, coupled to the fourth transistor to reduce leakage current through the third transistor.

Such a RAM cell can further be stacked with at least one more 4T RAM cell on a common Read Bit Line (RBL), have the logic value further stored in a diffusion capacitance of the first transistor and the second transistor, operate at voltages below threshold voltages for the first, second, third, and/or fourth transistors, where the threshold voltage is a 400 mV deviation from zero volts, and can further comprise a sense amplifier section, coupled to the storage section, for sensing the logic value stored.

A random access memory (RAM) cell in accordance with one or more embodiments of the present invention comprises a control section and a storage section, coupled to the storage section, wherein the storage section comprises complementary metal-oxide semiconductor (CMOS) transistors and the storage section is read by precharging the control section to a virtual drain voltage.

Such a RAM cell can include the storage section comprising a first transistor and a second transistor, wherein the first transistor stores a logic value of the RAM cell and the second transistor stores a complementary logic value of the RAM cell, the RAM cell being a 12T RAM cell, the storage section further comprising a third transistor and a fourth transistor, wherein the third transistor stores the logic value of the RAM cell and the fourth transistor stores the complementary logic value of the RAM cell, the control section comprising a first pull-up transistor, a second pull-up transistor, a third pull-up transistor, a fourth pull-up transistor, a first pass transistor, a second pass transistor, a third pass transistor, and a fourth pass transistor, wherein a gate of the first pull-up transistor is coupled to a drain of the fourth pass transistor and a gate of the third pass transistor, the RAM cell operating at voltages below a threshold voltage for the control section, the threshold voltage being a 400 mV deviation from zero volts, and a sense amplifier section, coupled to the storage section, for sensing the logic value stored in the RAM cell.

A method for writing a logic value stored in a Random Access Memory (RAM) cell in accordance with one or more embodiments of the present invention comprises lowering a virtual drain voltage to a control section of the RAM cell, and driving the logic value and a complement of the logic value onto a pair of storage transistors of the RAM cell.

Such a method further optionally comprises driving the logic value and the complement of the logic value onto at least a second pair of storage transistors of the RAM cell, and the RAM cell operating at voltages below a threshold voltage for the control section.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

References

[1] Benton Highsmith Calhoun and Anantha P. Chandrakasan. A 256-kb 65-nm sub-threshold sram design for ultra-low-voltage operation. *Solid-State Circuits, IEEE Journal of,* 42(3):680-688, 2007.

[2] T. Calin, M. Nicolaidis, and R. Velazco. Upset hardened memory design for submicron cmos technology. *Nuclear Science, IEEE Transactions on,* 43(6):2874-2878, 1996.

[3] J. Rabacy, *Digital Integrated Circuits: A Design Perspective,* Prentice Hall, 1996.

[4] Bo Zhai, S. Hanson, D. Blaauw, and D. Sylvester, A variation-tolerant sub-200 mv 6-t subthreshold sram, *Solid-State Circuits, IEEE Journal of,* 43(10):2338-2348, 2008.

What is claimed is:

1. A Four-Transistor (4T) random access memory (RAM) cell cache comprising:
   (a) a 4T RAM cell comprising:
      (1) a first transistor of a first conduction type;
      (2) a second transistor of a second conduction type, wherein the first transistor and the second transistor comprise a transmission gate;
      (3) a third transistor having a gate electrode coupled to the transmission gate and a source electrode coupled to a read control line for storing and reading a logic value in the 4T RAM cell; and
      (4) a fourth transistor, coupled to the third transistor to reduce leakage current through the third transistor; and
   (b) error correcting codes (ECC) configured to permit a single upset to occur per cache-line per refresh cycle.

2. The 4T RAM cell cache, of claim 1, wherein the 4T RAM cell is stacked with at least one more 4T RAM cell on a common Read Bit Line (RBL).

3. The 4T RAM cell cache of claim 1, wherein the logic value is further stored in a diffusion capacitance of the first transistor and the second transistor.

4. The 4T RAM cell cache of claim 1, wherein the 4T RAM cell operates at voltages below a threshold voltage for the first transistor.

5. The 4T RAM cell cache of claim 4, wherein the 4T RAM cell operates at voltages below the threshold voltage for the first transistor, and below a second threshold voltage for the second transistor.

6. The 4T RAM cell cache of claim 5, wherein the 4T RAM cell operates at voltages below the threshold voltage for the first transistor, the second threshold voltage for the second transistor, and a third threshold voltage for the third transistor.

7. The 4T RAM cell cache of claim 6, wherein the 4T RAM cell operates at voltages below the threshold voltage for the first transistor, the second threshold voltage for the second transistor, the third threshold voltage for the third transistor, and a fourth threshold voltage for the fourth transistor.

8. The 4T RAM cell cache of claim 4, wherein the threshold voltage is a 400 mV deviation from zero volts.

9. The 4T RAM cell cache of claim 1, further comprising a sense amplifier section, coupled to the storage section, for sensing the logic value stored in the 4T RAM cell.

10. The 4T RAM cell cache of claim 1, wherein the transmission gate passes a logical 1 as a supply voltage level.

* * * * *

UNITED STATES PATENT AND TRADEMARK OFFICE
CERTIFICATE OF CORRECTION

| | | |
|---|---|---|
| PATENT NO. | : 8,605,516 B2 | Page 1 of 1 |
| APPLICATION NO. | : 12/683989 | |
| DATED | : December 10, 2013 | |
| INVENTOR(S) | : Moore et al. | |

It is certified that error appears in the above-identified patent and that said Letters Patent is hereby corrected as shown below:

In the Specifications

Column 1

Line 21, please delete "The Government has certain rights in this invention pursuant to Grant No. CCF-0541461 awarded by the National Science Foundation (NSF)."

and insert --This invention was made with government support under Grant No. CCF0541461 awarded by the National Science Foundation and under Grant No. FA9453-08-M-0026 awarded by the U.S. Air Force. The government has certain rights in the invention.--

Signed and Sealed this
Sixth Day of May, 2014

Michelle K. Lee
*Deputy Director of the United States Patent and Trademark Office*